1

(12) United States Patent
Anolik et al.

(10) Patent No.: US 9,812,759 B2
(45) Date of Patent: Nov. 7, 2017

(54) REMOTE UNITS FOR DISTRIBUTED COMMUNICATION SYSTEMS AND RELATED INSTALLATION METHODS AND APPARATUSES

(71) Applicant: Corning Optical Communications Wireless Ltd, Airport (IL)

(72) Inventors: Rami Anolik, Beit Arie (IL); Ami Hazani, Ra'anana (IL)

(73) Assignee: Corning Optical Commuication Wireless Ltd, Airport City (IL)

( * ) Notice: Subject to any disclaimer, the term of this patent is extended or adjusted under 35 U.S.C. 154(b) by 0 days.

(21) Appl. No.: 15/482,105

(22) Filed: Apr. 7, 2017

(65) Prior Publication Data

US 2017/0214111 A1    Jul. 27, 2017

Related U.S. Application Data

(63) Continuation of application No. 14/444,447, filed on Jul. 28, 2014, now Pat. No. 9,661,781.

(60) Provisional application No. 61/860,553, filed on Jul. 31, 2013.

(51) Int. Cl.
| | |
|---|---|
| *H05K 5/02* | (2006.01) |
| *H01Q 1/00* | (2006.01) |
| *H05K 7/14* | (2006.01) |
| *H01Q 21/28* | (2006.01) |
| *H04W 16/26* | (2009.01) |
| *H04B 10/2575* | (2013.01) |
| *H04W 88/08* | (2009.01) |

(52) U.S. Cl.
CPC ............. *H01Q 1/007* (2013.01); *H01Q 21/28* (2013.01); *H04B 10/25753* (2013.01); *H04W 16/26* (2013.01); *H05K 5/0213* (2013.01); *H05K 7/1427* (2013.01); *H04W 88/085* (2013.01); *H05K 5/02* (2013.01)

(58) Field of Classification Search
CPC ...... H05K 5/02; H05K 5/0213; H05K 7/1427; H04B 1/40; H04B 10/25753; H04W 88/085; H01Q 1/007; H01Q 1/2216; H01Q 1/2291; H01Q 21/28
See application file for complete search history.

(56) References Cited

U.S. PATENT DOCUMENTS

| | | | |
|---|---|---|---|
| 6,084,772 A | 7/2000 | Pell et al. | |
| 6,151,482 A * | 11/2000 | Eriksson | H04W 24/00 455/67.11 |
| 7,514,804 B2 | 4/2009 | Wang | |
| 7,706,803 B2 | 4/2010 | Benco et al. | |
| 8,235,349 B1 | 8/2012 | Conklin et al. | |
| 8,385,850 B1 | 2/2013 | Thompson et al. | |
| 2013/0150063 A1 | 6/2013 | Berlin et al. | |
| 2014/0179244 A1* | 6/2014 | Colapietro | H04B 1/40 455/90.2 |

(Continued)

OTHER PUBLICATIONS

Oberon Inc.—Suspended Ceiling Access Point Enclosures; 6 Pages; http://www.oberonwireless.com/plenum-rated-access-point-enclosures.php; Downloaded Jun. 4, 2014.

*Primary Examiner* — Matthew Nguyen
(74) *Attorney, Agent, or Firm* — C. Keith Montgomery (57) ABSTRACT

Remote units are mounted in a support structure so that cooling air flow is not impeded by the support structure. The remote units may have RF communications circuitry and other components that generate heat in the provision of wireless services.

19 Claims, 5 Drawing Sheets

(56) References Cited

U.S. PATENT DOCUMENTS

2016/0135313 A1  5/2016  Freeman
2017/0054496 A1  2/2017  Hazani

* cited by examiner

REMOTE UNITS FOR DISTRIBUTED COMMUNICATION SYSTEMS AND RELATED INSTALLATION METHODS AND APPARATUSES

RELATED APPLICATIONS

This application is a continuation of U.S. application Ser. No. 14/444,447, filed Jul. 28, 2014, which claims the benefit of priority under 35 U.S.C. §119 of U.S. Provisional Application No. 61/860,553 filed on Jul. 31, 2013, the content of which is relied upon and incorporated herein by reference in its entirety.

BACKGROUND

The disclosure relates generally to remote antenna units.

Distributed antenna systems (DASs) or distributed communication systems provide wireless communications and other services within a building, stadium, and other infrastructures. One approach to deploying a DAS involves the use of radio frequency (RF) antenna coverage areas, also referred to as "antenna coverage areas." The antenna coverage areas are provided by remote antenna units (RAUs), or more generally 'remote units' in the DAS. Remote units provide antenna coverage areas typically having radii from a few meters up to twenty (20) meters. If the antenna coverage areas each cover a small area, there are typically only a few users (clients) per antenna coverage area. This minimizes the amount of RF bandwidth shared among the wireless system users.

Remote units are commonly mounted on the ceiling in such a way that radiofrequency signals from the remote unit's antenna are not obstructed by the ceiling. If active remote antenna units are part of the DAS, the DAS designer must also ensure that the mounting structure allows for sufficient dissipation of the heat generated by remote unit's electronics. If a remote unit relies on airflow for cooling, the mounting environment must allow for relatively unobstructed airflow. It is also desirable that the remote unit mounting structure, as well as the remote unit itself, be as unobtrusive and aesthetically pleasing as possible.

Figure 1:
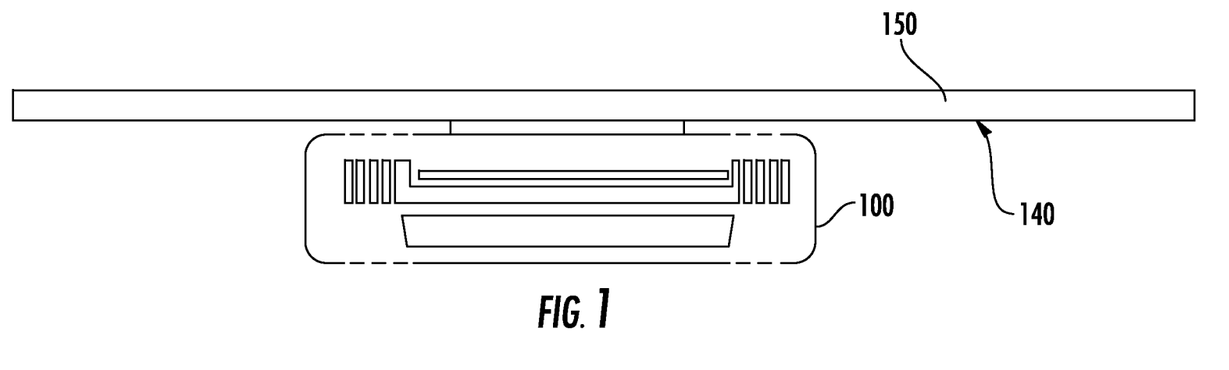
FIG. 1 illustrates a remote unit for use in a distributed communications system.

FIG. 1 shows a typical remote unit 100 for use in a distributed antenna system. The remote unit 100 is attached at the lower surface 140 of a ceiling tile 150. In this arrangement, cooling air flow through the remote unit 100 may be partially blocked by the tile.

No admission is made that any reference cited herein constitutes prior art. Applicant expressly reserves the right to challenge the accuracy and pertinency of any cited documents.

DETAILED DESCRIPTION

Figure 2:
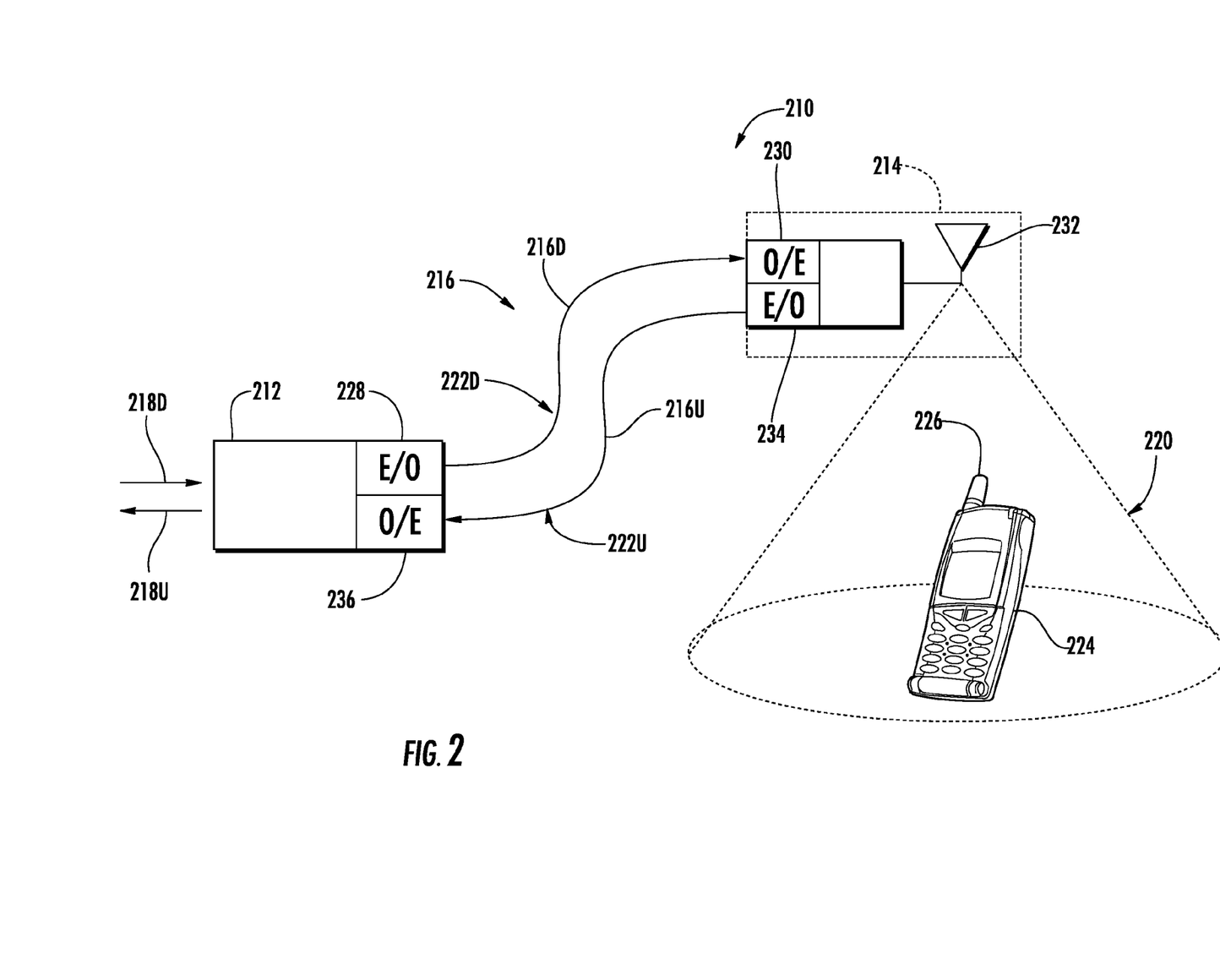
FIGS. 2 and 3 are schematic views of an exemplary optical fiber-based distributed antenna system (DAS).
Figure 3:
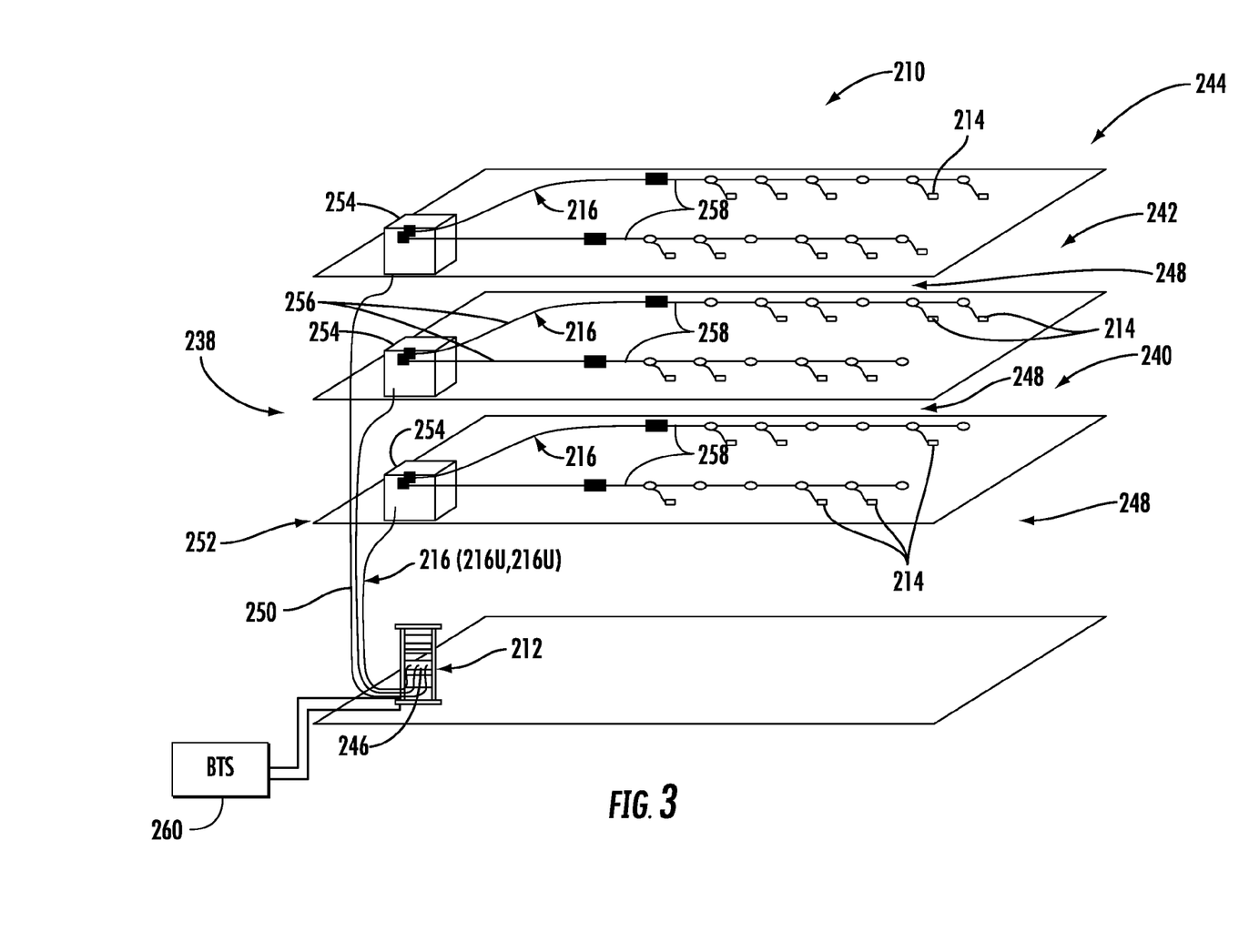
Figure 4:
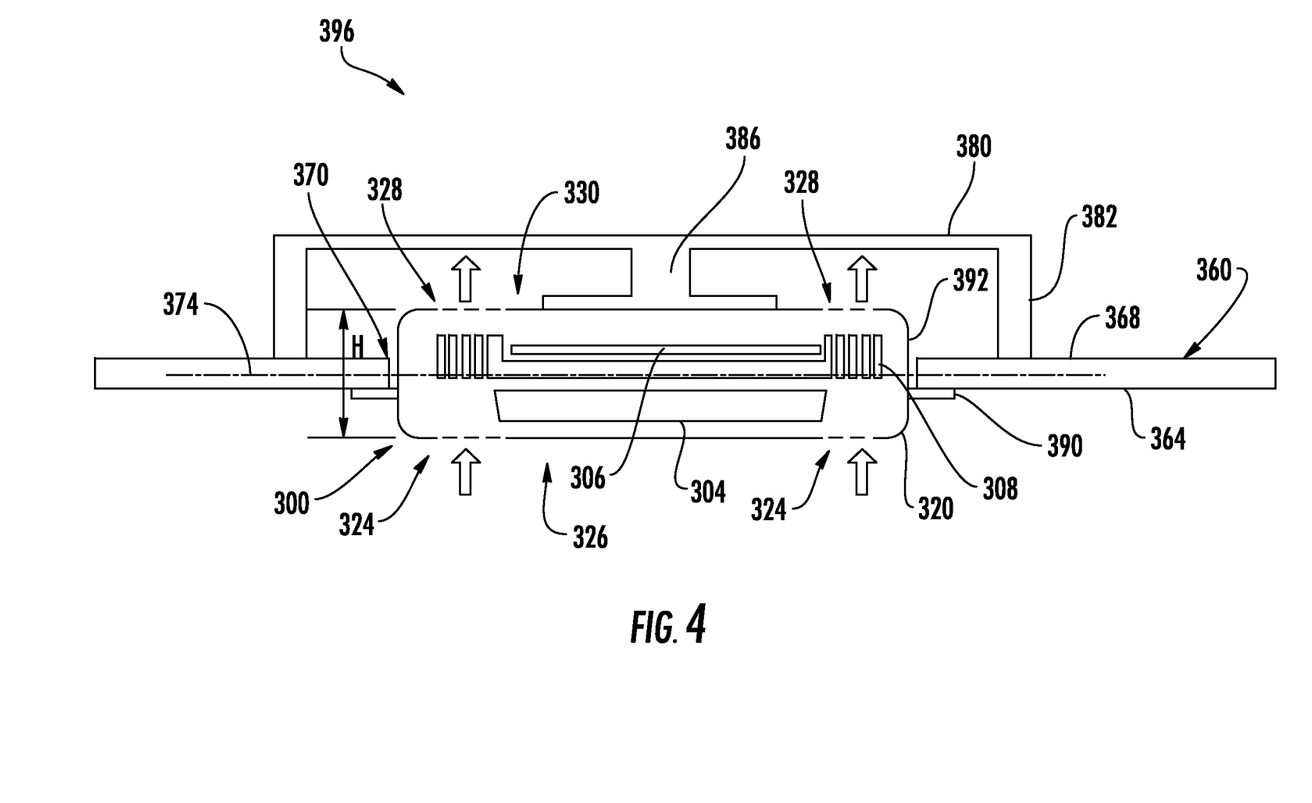
FIG. 4 is a section view of a remote unit installation according to a present embodiment.

Before discussing the remote unit installation according to the present embodiment in FIG. 4, FIGS. 2 and 3 are examples of distributed antenna systems (DASs) that can incorporate remote antenna unit installations according to the present embodiments.

FIG. 2 is a schematic diagram of an embodiment of a DAS. In this embodiment, the system is an optical fiber-based distributed communication system in the form of a DAS 210. The optical-fiber based DAS 210 is configured to create one or more antenna coverage areas for establishing communications with wireless client devices located in the radio frequency (RF) range of the antenna coverage areas. The DAS 210 provides RF communications services (e.g., cellular services). The DAS 210 includes head end equipment (HEE) in the form of a head end unit (HEU) 212, one or more remote units 214, and an optical fiber 216 that optically couples the HEU 212 to the remote unit 214.

The HEU 212 is configured to receive communications over downlink electrical RF communications signals 218D from a source or sources, such as a network or carrier as examples, and provide such communications to the remote unit 214. The HEU 212 is also configured to return communications received from the remote unit 214, via uplink electrical RF communications signals 218U, back to the source or sources. The optical fiber 216 includes at least one downlink optical fiber 216D to carry signals communicated from the HEU 212 to the remote unit 214 and at least one uplink optical fiber 216U to carry signals communicated from the remote unit 214 back to the HEU 212. One downlink optical fiber 216D and one uplink optical fiber 216U could be provided to support multiple channels, each using wavelength-division multiplexing (WDM).

The DAS 210 has an antenna coverage area 220 that can be substantially centered about the remote unit 214. The remote unit 214 is configured to receive downlink optical RF communications signals 222D from the HEU 212 and transmit the content downlink optical RF communications signals 222D wirelessly within the coverage area 220. The HEU 212 is adapted to perform or to facilitate any one of a number of wireless applications, including but not limited to Radio-over-Fiber (RoF), radio frequency identification (RFID), wireless local-area network (WLAN) communication, public safety, cellular, telemetry, and other mobile or fixed services. Shown within the antenna coverage area 220 is a client device 224 in the form of a mobile device, which may be a cellular telephone as an example. The client device 224 can be any device that is capable of receiving RF communication signals. The client device 224 includes an antenna 226 (e.g., a wireless card) adapted to receive and/or send electromagnetic RF communications signals.

The HEU 212 includes an electrical-to-optical (E/O) converter 228 to communicate the electrical RF communications signals over the downlink optical fiber 216D to the remote unit 214, to in turn be communicated to the client device 224 in the antenna coverage area 220 formed by the remote unit 214. The E/O converter 228 converts the downlink electrical RF communications signals 218D to downlink optical RF communications signals 222D to be communicated over the downlink optical fiber 216D. The remote unit 214 includes an optical-to-electrical (O/E) converter 230 to convert received downlink optical RF communications signals 222D back to electrical RF communications signals to be communicated wirelessly through an antenna 232 of the remote unit 214 to client devices 224 located in the antenna coverage area 220.

Each of the remote units 214 includes an antenna system capable of transmitting RF communications into and receiving RF communications from a coverage area. The antenna 232 is configured to receive wireless RF communications from client devices 224 in the antenna coverage area 220 and communicate electrical RF communications signals representing the wireless RF communications to an E/O converter 234 in the remote unit 214. The E/O converter 234 converts the electrical RF communications signals into uplink optical RF communications signals 222U to be communicated over the uplink optical fiber 216U. The E/O converter 234 and the O/E converter 30 constitute a "converter pair," as illustrated in FIG. 2. The E/O converter 228 includes a laser suitable for delivering sufficient dynamic range for the RoF applications described herein.

An O/E converter 236 in the HEU 212 converts the uplink optical RF communications signals 222U into uplink electrical RF communications signals, which are communicated as uplink electrical RF communications signals 218U back to a network or other source. The O/E converter 236 is a photodetector, or a photodetector electrically coupled to a linear amplifier. The E/O converter 228 and the O/E converter 236 also constitute a "converter pair."

FIG. 3 illustrates a distributed communication system deployed in a building infrastructure. The figure is a partially schematic cut-away diagram of a building infrastructure 238 with an expanded schematic of the DAS 210 deployed therein. The infrastructure 238 generally represents any type of building or other structure in which the optical fiber-based DAS 210 can be deployed, including indoor, outdoor or partially outdoor deployment sites such as stadiums. The building infrastructure 238 in this embodiment includes a first (ground) floor 240, a second floor 242, and a third floor 244. The floors 240, 242, 244 are serviced by the HEU 212 through a main distribution frame 246 to provide antenna coverage areas 248 within the building infrastructure 238. Only the ceilings of the floors 240, 242, 244 are shown in FIG. 3 for simplicity of illustration. A main cable 250 has a number of different sections that facilitate the placement of a large number of remote units 214 in the building infrastructure 238. Each remote unit 214 in turn services its own coverage area 248. Any number of remote units 214 can be deployed on each floor of the infrastructure 238. For example, at least three remote units 214 can be deployed on each of at least three, four, or five or more floors of the infrastructure 238. The main cable 250 can include, for example, a riser cable 252 that carries all of the downlink and uplink optical fibers 216D, 216U to and from the HEU 212. The riser cable 252 may be routed through an interconnect unit (ICU) 254 to one or more optical fiber cables 256. The ICU 254 may also be configured to provide power to the remote units 214.

The main cable 250 enables the multiple optical fiber cables 256 to be distributed throughout the building infrastructure 238 (e.g., fixed to the ceilings, walls, panels, or other support surfaces of each floor 240, 242, 244) to provide the antenna coverage areas 48 for the first, second and third floors 240, 242 and 244. A base transceiver station (BTS) 260 is connected to the HEU 212, and can be co-located or located remotely from the HEU 212. A BTS is any station or source that provides an input signal to the HEU 212 and can receive a return signal from the HEU 212. In a typical cellular system, for example, a plurality of BTSs are deployed at a plurality of remote locations to provide wireless telephone coverage. Each BTS serves a corresponding cell and when a mobile station enters the cell, the BTS communicates with the mobile station. Each BTS can include at least one radio transceiver for enabling communication with one or more subscriber units operating within the associated cell. Radio input could also be provided by a repeater or picocell.

The distributed communication system 210 in FIGS. 2 and 3 provides point-to-point communications between the HEU 212 and the remote units 214. Each remote unit 214 communicates with the HEU 212 over a distinct downlink and uplink optical fiber pair 216D/216U. Whenever a remote unit 214 is installed in the optical fiber-based DAS 210, the remote unit 214 is connected to a distinct downlink and uplink optical fiber pair connected to the HEU 212. The downlink and uplink optical fibers 216D/216U may be provided in the optical fiber 216. Multiple downlink and uplink optical fiber pairs 216D/216U can be provided in a fiber optic cable to service multiple remote units 214 from a common fiber optic cable. For example, with reference to FIG. 3, remote units 214 installed on a given floor 240, 242, or 244 may be serviced from the same optical fiber 216, which may have multiple nodes where distinct downlink and uplink optical fiber pairs 216D/216U are connected to a given remote unit 214.

FIG. 4 is a sectional view of a remote unit deployment according to a first embodiment. The deployment can be in any support surface, such as a wall or ceiling, ceiling tile, or other planar or generally planar surface, in a deployment infrastructure. The remote unit 300 can be generally similar or identical in function to the remote units 214 discussed above, and may include the additional features as described below. In FIG. 4, the remote unit 300 is illustrated with an antenna unit 304 for transmission of RF signals into and reception of RF signals (including, for example, voice and data information) from an RF coverage area. An electronics board 306 is attached to a heat sink 308 in order to dissipate the heat generated by the electronic components. The electronics board 306 may carry out processing and conversion functions described with reference to the remote units 214. The components of the remote unit 300 can be contained within an enclosure 320. The remote unit 300 can have all of the functionalities, components, and capabilities of the remote units 214 discussed with respect to FIGS. 2 and 3.

The enclosure 320 has first ventilation apertures 324 at a first side 326 of the enclosure 320, and second ventilation apertures 328 at a second side 330 of the enclosure. The ventilation apertures 324, 328 provide a pathway for cooling air to flow through the remote unit 300 to cool the components therein.

The exemplary remote unit 300 is deployed in a generally planar support structure 360 having a first generally planar surface 364 and a second generally planar surface 368. The support structure 360 has a mounting aperture 370 that can, for example, generally conform to the shape of the exterior periphery of the enclosure 320. Examples of exterior peripheral shapes of the enclosure 320 are discussed below with reference to FIGS. 5 and 6. In the mounting configuration illustrated in FIG. 4, a plane 374 extending through the support structure 360 also extends through the enclosure 320, so that the first side of the remote unit enclosure 320 extends past (or, below in FIG. 4) the plane of the first generally planar surface 364, and the second side 330 of the remote unit enclosure 320 extends past (or, above in FIG. 4) the plane of the second generally planar surface 368.

A mounting component 380 supports the remote unit 300 within the support structure 360. The mounting component 380 can have a support mount 382 configured to connect to and/or abut the support structure 360. The support mount 382 can have a continuous mounting periphery contacting the support structure, or individual projections or 'legs'. The mounting component 380 can also have a remote mount 386 that connects to the enclosure 320 to secure the remote unit 300 to the mounting component 380 and to hold the remote unit 300 in place within the support structure 360. In the illustrated embodiment, the remote mount 386 is secured to the second, or upper, side 330 of the enclosure 320. A peripheral flange 390 can be included around the periphery 392 of the enclosure 320. The peripheral flange 390 can abut a surface of the support structure 360, which in the illustrated embodiment is the first generally planar surface, or lower surface, 364. The peripheral flange 390 can serve the purposes of more securely fixing the remote unit 300 to the support structure 360, and of hiding the mounting aperture 370 from view. The mounting component 380 can be formed from a skeletal frame with few large surfaces so that it does not unduly obstruct air flowing into and out of the ventilation aperture 328.

The illustrated arrangement of the remote unit 300 in the support structure provides advantageous cooling properties to the installation. In one exemplary mode of operation of the remote unit 300, air flow, indicated by the large arrows, enters the first side 324 of the remote unit 300 through the first ventilation apertures 324, flows over fins of the heat sink 308, and exits the second side 330 of the remote unit 300 through the second ventilation apertures 328. Heat generated through operation of the remote unit 300 is thus dissipated from the heat sink 308 and from the other components. The flow of air through the remote unit 300 can be essentially continuous, and can flow from first side to second, and vice versa. Ambient temperature conditions on either side of the support structure 360 can drive movement of air through the remote unit 300. If desired, a fan (not illustrated) can be included in the remote unit 300 to drive cooling air through the enclosure 320.

According to the above described embodiment, the surface of the support structure 360 does not impede the flow of cooling air through the remote unit 300, and cooling air travels freely between first and second sides of the support structure 360. A minimal structure (e.g., skeletal) of the mounting component 380 allows air to pass freely into and out of the second ventilation apertures 328.

The remote unit 300 also has an aesthetic advantage in that it protrudes only slightly from the first generally planar surface 364 of the mounting structure 360. One possible mounting arrangement of the remote unit 300 is a ceiling mounting, in which the support structure 360 corresponds to a section of ceiling, such as a ceiling tile. In this embodiment, the first generally planar surface 364 is the lower surface of the ceiling visible from below to occupants of the infrastructure. In typical office, commercial, etc. environments, it is preferable for electronic components such as the remote unit 300 to be as unobtrusive as possible. The remote unit 300, labeled with a height H, has only a portion of its height H protruding from the first surface 364 of the support structure 360 so that less of the remote unit is exposed to view by occupants. According to one aspect, less than three quarters of the height H of the remote unit 300 can extend past the surface 364. According to another aspect, less than half of the height H can extend past the surface 364. The mounting arrangement can be designed to allow a small portion of the remote unit 300 to protrude beyond the surface 364 so that the support structure 360 does not interfere with RF transmissions from the antenna unit 304.

According to another aspect, the support structure 360, the remote unit 300, and the mounting component 380 can be provided as an installation assembly 396. The installation assembly 396 can be assembled as a unit before delivery to a deployment site, for example, or delivered as a collection of components to be wholly or partially assembled on site. In one such application, the support structure 360 can correspond in dimension to standardized ceiling tiles. For example, conventional two (2) foot square ceiling tiles can be adapted to accommodate a ceiling mounting arrangement of a remote unit. The ceiling tile can be made from conventional materials such as those found in commercial building drop ceilings, such as mineral fiber pulp (e.g. gypsum and cellulose fiber) held together by a binder. When installing a preassembled installation assembly 396, the technician drops the installation assembly 396 into the building's ceiling tile support frame (not shown) as in the case of installing a conventional ceiling tile. The remote unit 300 can then be connected to external cables, such as cables having optical fibers or electrical conductors for transmitting voice, data, etc. information, and electrical conductors for conveying power and information (not shown).

If the installation assembly 396 is not preassembled, or only partially assembled, the installation process can take place in separate steps. For example, the mounting structure 380 can be provided as secured to the support structure 360, and that subassembly can be dropped into the ceiling tile support frame. The remote unit 300 can then be secured to the mounting structure 380. The flange 390 can be an integral part of the enclosure 320, or mounted to the enclosure 320 or the support structure 360 in a separate step. The remote unit 300 is then connected to external data, RF, and/or power cabling.

An installation assembly may also include a support structure integrally formed with the enclosure 320, so that a separate remote mount is not required to attach the remote unit 300 to the support structure. The installation assembly can then be dropped into an existing drop ceiling support frame, for example, and connected to external data, RF, and/or power cabling. In this example, the support structure can be formed from a thin metallic plate having an aperture configured to receive the remote unit 300, and an exterior periphery configured to rest in a drop ceiling support frame.

The mounting arrangement in FIG. 4 need not be deployed as a ceiling mount. A wall mount in a vertically extending support structure is also possible.

Figure 5:
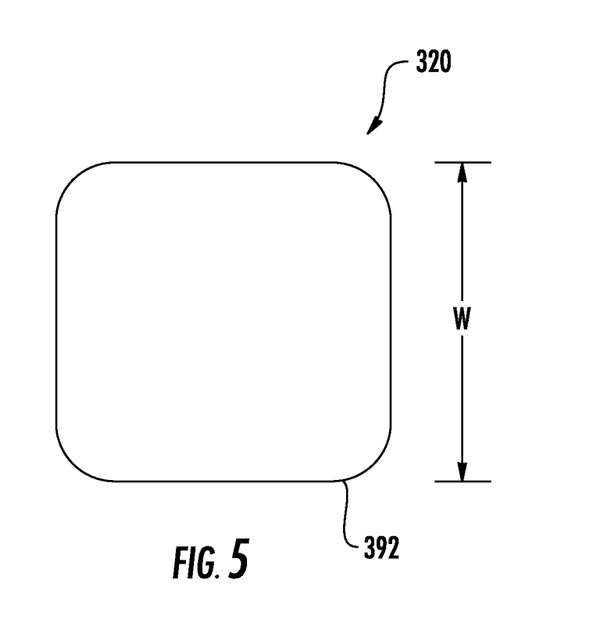
FIGS. 5 and 6 are schematic top plan views of exemplary remote units.
Figure 6:
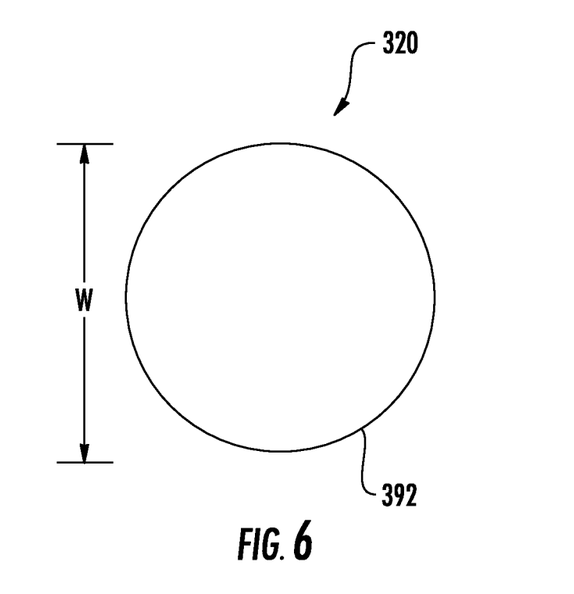

FIGS. 5 and 6 are schematic top plan views of exemplary remote unit peripheral shapes. The exemplary remote units have generally flat, disc-like shapes. The width dimension W in thus can be at least two, three or more times are large as the height dimension H shown in FIG. 4. FIG. 5 illustrates a generally rectangular, in this case square, peripheral shape having rounded corners. FIG. 6 illustrates a round peripheral shape.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of installing a remote unit of a distributed communication system in a building infrastructure, comprising:

providing an installation assembly comprising: a support structure having a first side, a second side, and a mounting aperture extending from the first side to the second side; a remote unit comprising an enclosure and at least one antenna unit configured to transmit RF communication signals into a coverage area, the remote unit being mounted within the mounting aperture so that a first side of the remote unit is visible at a first side of the support structure; and a mounting component to secure the remote unit to the support structure, wherein the remote unit has at least one ventilation aperture to allow cooling air to flow between the first side and a second side of the remote unit, and between the first side and second sides of the support structure;
mounting the installation assembly to a portion of the building infrastructure; and
connecting the remote unit to at least one cable capable of conveying at least one of data and RF communications.

2. The method of claim 1, wherein the remote unit comprises at least one optical-to-electrical converter, and wherein connecting the remote unit to at least one cable comprises connecting the remote unit to at least one optical fiber.

3. The method of claim 2, wherein the remote unit comprises a circuit board and a heat sink, and wherein the at least one ventilation aperture comprises a plurality of first ventilation apertures at a first side of the enclosure and a plurality of second ventilation apertures at a second side of the enclosure.

4. The method of claim 3, wherein the first side of the remote unit protrudes beyond the first side of the support structure and the second side of the remote unit protrudes beyond the second side of the support structure.

5. The method of claim 4, wherein mounting the installation assembly comprises installing the support structure into a ceiling tile support frame.

6. The method of claim 5, wherein the support structure comprises a metallic plate having an exterior periphery configured to rest in the ceiling tile support frame.

7. The method of claim 5, wherein installing the support structure into a ceiling tile support frame comprises installing the support structure into a ceiling tile support frame for ceiling tiles having sides of about two feet in length.

8. The method of claim 5, wherein the first and second sides of the support structure are generally planar surfaces.

9. The method of claim 4, wherein the mounting component includes a support mount fixed to the second side of the support structure and a remote mount secured to a second side of the remote unit.

10. A distributed communication system deployed within a building infrastructure, comprising:
head-end equipment configured to receive downlink electrical RF communications services signals and to convert the downlink electrical RF communications services signals into downlink optical RF communications services signals to be communicated over at least one optical RF communications services downlink; and
a plurality of remote unit assemblies communicatively coupled to the head-end equipment to receive downlink optical RF communications services signals, at least one of the remote unit assemblies comprising:
a remote unit comprising an enclosure and at least one antenna unit configured to transmit RF communication signals into a coverage area, the remote unit being mounted in a mounting aperture of a support structure so that a first side of the remote unit is visible at a first side of the support structure,
wherein the remote unit has at least one ventilation aperture to allow cooling air to flow between the first and a second sides of the remote unit and between the first side of the support structure and a second side of the support structure.

11. The distributed communication system of claim 10, wherein the remote unit comprises a circuit board and a heat sink, and wherein the at least one ventilation aperture comprises a plurality of first ventilation apertures at a first side of the enclosure and a plurality of second ventilation apertures at a second side of the enclosure.

12. The distributed communication system of claim 11, wherein the first side of the remote unit protrudes beyond the first side of the support structure and the second side of the remote unit protrudes beyond the second side of the support structure.

13. The distributed communication system of claim 12, wherein the distributed communication system is deployed in at least three floors of a building infrastructure, each floor having at least two of the remote unit assemblies.

14. The distributed communication system of claim 13, wherein the support structure is accommodated within a ceiling tile support frame of the infrastructure.

15. The distributed communication system of claim 14, wherein the ceiling tile support frame supports ceiling tiles having sides two feet in length.

16. The distributed communication system of claim 14, wherein the remote unit assembly further comprises a flange configured to at least partially cover the mounting aperture.

17. The distributed communication system of claim 14, wherein the first and second sides of the support structure are generally planar surfaces.

18. The distributed communication system of claim 12, wherein the remote unit assembly further comprises a mounting component secured to a second side of the remote unit.

19. The distributed communication system of claim 18, wherein the mounting component includes a support mount configured to abut the second side of the support structure and a remote mount secured to the remote unit.

* * * * *